(12) United States Patent
Hamilton et al.

(10) Patent No.: US 7,736,698 B2
(45) Date of Patent: Jun. 15, 2010

(54) METHOD OF DEPOSITING ZINC OXIDE COATINGS ON A SUBSTRATE

(75) Inventors: Mark M. Hamilton, Toledo, OH (US); Michael P. Remington, Jr., Toledo, OH (US); David A. Strickler, Toledo, OH (US); Thomas Kemmerley, Monclova, OH (US)

(73) Assignees: Pilkington Group Limited, St. Helens (GB); Arkema, Inc., King of Prussia, PA (US)

( * ) Notice: Subject to any disclaimer, the term of this patent is extended or adjusted under 35 U.S.C. 154(b) by 416 days.

(21) Appl. No.: 11/800,039

(22) Filed: May 3, 2007

(65) Prior Publication Data

US 2007/0264429 A1 Nov. 15, 2007

Related U.S. Application Data

(60) Provisional application No. 60/798,463, filed on May 5, 2006, provisional application No. 60/840,916, filed on Aug. 29, 2006.

(51) Int. Cl.
*C23C 16/00* (2006.01)
(52) U.S. Cl. ............... 427/255.33; 427/248.1; 427/255.36
(58) Field of Classification Search ............ None
See application file for complete search history.

(56) References Cited

U.S. PATENT DOCUMENTS

| 4,751,149 A | 6/1988 | Vijaykumr et al. |
| 5,002,796 A | 3/1991 | Nishida |
| 5,205,089 A * | 4/1993 | Cunningham ............... 52/79.1 |
| 2002/0117199 A1* | 8/2002 | Oswald ..................... 136/256 |
| 2003/0185979 A1* | 10/2003 | Nelson .................... 427/248.1 |

FOREIGN PATENT DOCUMENTS

WO    WO 2007/029014 A1    3/2007

OTHER PUBLICATIONS

Wang, L. J. of Cryst. Growth. 283 (2005) 87-92.*
Shealy, James R., "Preparation and Properties of Zinc Oxide Films Grown by the Oxidation of Diethylzinc", Journal of the Electro-Chemical Society, vol. 128, No. 3, 1981, pp. 558-561.
Roth, A.P. and Williams, D.F., "Properties of Zinc Oxide Films Prepared by the Oxidation of Diethylzinc", Journal of Applied Physics, vol. 52, No. 11 (1981), pp. 6685-6692.
Li, X., et al., "P-Type ZnO Thin Films Formed by CVD Reaction of Diethylzinc and NO Gas", Electrochemical and Solid State Letters, vol. 6, No. 4 (2003) pp. C56-C58.
Smith, Frank T.J., "Metalorganic Chemical Vapor Deposition of Oriented ZnO Films Over Large Areas", Applied Physics Letters, vol. 43, No. 12 (1983) pp. 1108-1110.
Lau, C.K. et al., "Growth of Epitaxial ZnO Thin Films by Organometallic Chemical Vapor Deposition", Journal of the Electro-chemical Society, USA, vol. 127, No. 8 (1980) pp. 1843-1847.

* cited by examiner

*Primary Examiner*—Timothy H Meeks
*Assistant Examiner*—Joseph Miller, Jr.
(74) *Attorney, Agent, or Firm*—Marshall & Melhorn, LLC

(57) ABSTRACT

A process for the production of a zinc oxide coating on a moving glass substrate provides a precursor mixture of a dialkylzinc compound, an oxygen-containing compound and an inert carrier gas. The precursor mixture is directed along a surface of the glass substrate in an atmospheric pressure, on-line, chemical vapor deposition process. The precursor mixture is reacted at the surface of the glass substrate to form a zinc oxide coating, essentially devoid of nitrogen, at a growth rate of >100 Å/second.

16 Claims, No Drawings

METHOD OF DEPOSITING ZINC OXIDE COATINGS ON A SUBSTRATE

RELATED APPLICATIONS

This application is claiming the benefit, under 35 U.S.C. 119(e) of the provisional applications filed May 5, 2006 and Aug. 29, 2006 under 35 U.S.C. 111 (b), which were granted Ser. Nos. 60/798,463 and 60/840,916, respectively. These provisional applications are each hereby incorporated by reference.

BACKGROUND OF THE INVENTION

The present invention relates to a continuous, chemical vapor deposition (CVD) method for producing a coated glass article, particularly, coated architectural glass or automotive glass. Specifically, the invention relates to an improved method for producing a glass article coated with a layer of zinc oxide.

Zinc oxide films have previously been described in the patent literature.

U.S. Pat. No. 4,751,149 describes deposition of zinc oxide films by a chemical vapor deposition (CVD) process for use in photovoltaic devices. The process described introduces an organozinc compound, an oxidant and an inert carrier gas into a chamber containing a substrate heated to a temperature in the range of 60° C. to 350° C. The films formed are said to contain hydrogen and may be modified to contain a Group XIII element by introducing volatile Group XIII compounds into the chamber along with the organozinc compound and oxidant.

U.S. Pat. No. 5,002,796 describes a functional zinc oxide thin film having high light permeability and low resistivity which can be obtained at a low temperature of about 200° C. on an inexpensive substrate such as glass by a method of activating a starting material gas by means of activation energy, in a space different from a film-forming space thereby forming a precursor contributing to the formation of a deposited film, activating a starting material gas in a space different from the film-forming space and the space just-mentioned above by means of activation energy thereby forming an active species that chemically reacts with the precursor, and introducing the precursor and the active species into the film-forming space, thereby depositing a film, wherein the starting material gas for forming the precursor is an alkyl zinc compound and the starting material for forming the active species is an oxygen gas or an ozone gas. This enables mass production of photovoltaic devices at high efficiency using a PN junction or PIN junction or high performance flat display device using liquid crystals, by which practical provision of power sources for domestic equipments or power sources for electric power appliance or large area display device can be obtained at a reduced cost.

Zinc oxide films have also previously been described in the non-patent, scientific literature.

Shealy, James R. et al., "Preparation and Properties of Zinc Oxide Films Grown by the Oxidation of Diethylzinc", Journal of the Electrochemical Society, Vol. 128, No. 3, (1981), pg. 558-561, describes the preparation and properties of zinc oxide films grown by the oxidation of diethylzinc. Growth above 250° C. with an oxygen to diethylzinc mole ratio in excess of 10 is said to result in stable films of zinc oxide, free from carbon contamination or zinc-ethyl groups. Details are provided of these growth conditions and also of the resulting growth parameters in this paper. The physical properties of films grown by this technique are also described, with particular emphasis on their IR absorption characteristics, stoichiometry, refractive index, and crystallographic orientation as a function of the growth conditions. Films are shown to have an oxygen deficiency, which increases with growth temperature, as does their refractive index. Film orientation, along the c-axis, is also found to improve with increasing growth temperatures.

Roth, A. P. and Williams, D. F., "Properties of Zinc Oxide Films Prepared by the Oxidation of Diethylzinc", Journal of Applied Physics, Vol. 52, No. 11 (1981), pg. 6685-6692, describes polycrystalline transparent semiconducting zinc oxide films deposited by the oxidation of diethylzinc. The film growth rate is controlled by a complex multistep oxidation process, which is dominated by radical reactions. Samples deposited between 280 and 350° C. have a conductivity varying from $10^{-2}$ to 50 $\Omega^{-1}$ cm$^{-1}$. The electrical properties of the films which are typical of polycrystalline material with small crystallites are shown to depend very closely on the film growth conditions. A study of oxygen chemisorption at grain boundaries confirms the importance of grain boundary effects in ZnO polycrystalline films.

Li, X. et al., "P-Type ZnO Thin Films Formed by CVD Reaction of Diethylzinc and NO Gas", Electrochemical and Solid-State Letters", Vol 6, No. 4 (2003) pg. C56-C58, discusses the use of nitric oxide (NO) gas to dope ZnO p-type films, fabricated using metallorganic chemical vapor deposition (CVD) reaction of a Zn metallorganic precursor and NO gas. NO gas is used to supply both O and N to form a N-doped ZnO (ZnO:N) film. Auger electron spectroscopy analysis indicated that, under Zn-rich conditions, the N concentration in the film is readily detectable, with the highest concentration being ~3 atom %. For concentrations greater than 2 atom %, the films are p-type. The carrier concentration varies from $1.0\times10^{15}$ to $1.0\times10^{18}$ cm$^{-3}$ and the mobility is approximately $10^{-1}$ cm$^2$ V$^{-1}$. The minimum film resistivity achieved is ~20 ohm-cm.

Known processes for the production of zinc oxide layers on a substrate are limited in the thickness or number of the films formed given the low efficiency of the known deposition processes, and also by powder formation (pre-reaction) of the reactive elements. Therefore, it is desired to devise an improved process for the formation of zinc oxide coatings on a substrate.

SUMMARY OF THE INVENTION

In accordance with the present invention, there is provided an improved method for the deposition of a zinc oxide coating on a major surface of a substrate. Specifically, the invention relates to the dynamic atmospheric pressure chemical vapor deposition of a zinc oxide coating at commercially viable deposition rates from a combination of a dialkylzinc compound, an inorganic oxygen-containing compound and an inert carrier gas, on a glass substrate that is moving at a predetermined speed. It has been found, in conjunction with the method of the present invention, that the presence of nitric oxide (NO) as the oxygen-containing compound allows the use of diethylzinc, a dialkylzinc compound which is pyrophoric, to be combined with such oxygen-containing compound without undergoing ignition and premature reaction at a preferred deposition temperature of 565°-760° C. Also, minimal nitrogen has been found to be incorporated into the coating, thereby leaving a substantially "pure" zinc oxide coating on the substrate. The zinc oxide coating can be used alone or in combination with additional coatings applied to the substrate. Such zinc oxide coatings may be useful as low emissivity and/or solar control layers in architectural window applications. Other potential applications include: photovoltaic devices, solid state lighting (LEDs and OLEDs), induction heating, flat panel displays and touch panel screens, transparent thin film transistors (TFT) that have applications in RFID tags and integrated circuits.

In the method of the present invention, precursor materials including a dialkylzinc compound, an oxygen-containing compound, and a carrier gas or gases are combined within a distributor beam device or the like, and the mixture is directed toward and along the surface of the glass substrate passing therebeneath. A preferred combination of precursor materials includes diethylzinc (DEZ), nitric oxide (NO) as the oxygen-containing compound and helium and/or nitrogen as the inert carrier gas. A combination of dimethyl zinc (DMZ), nitric oxide (NO) as the oxygen-containing compound, and helium and/or nitrogen has also been found to be quite effective in forming zinc oxide films in the context of the present invention.

With the method of the present invention, zinc oxide coatings are produced at rates greater than 100 Å/sec, preferably greater than 200 Å/sec.

DETAILED DESCRIPTION OF THE INVENTION

The method of the present invention is preferably carried out in an on-line, float glass production process, which is well known in the art. An example of such a process can be found in U.S. Pat. No. 5,798,142, which is incorporated by reference herein.

In a preferred embodiment of the present invention, a heated glass substrate is provided, the substrate having a surface on which the coating is to be deposited. A dialkylzinc compound of the form $R^1R^2Zn$ where $R^{1-2}$ can be the same or different alkyl or aryl groups such as methyl, ethyl, isopropyl, n-propyl, n-butyl, sec-butyl, phenyl or substituted phenyl, an oxygen-containing compound and an inert carrier gas, are combined to form a precursor mixture, which is directed toward and along the surface to be coated, preferably in a laminar flow. The mixture is reacted at or near the surface of the glass substrate to form a zinc oxide coating. Subsequently, the coated glass substrate is cooled to ambient temperature. Preferably, the inert carrier gas is either helium or nitrogen or a combination thereof.

While other dialkylzinc compounds, for example, the tetramethyl ethylene diamine adduct of dialkylzinc (TMEDA) and diphenylzinc, may be used in embodiments of the present invention, it has been found that diethylzinc (DEZ) is the preferred organozinc compound for use in the present invention. Nitric oxide (NO) is the preferred oxygen source for use in the present invention, but it is possible, within the scope of the present invention, that other oxygen sources for example, sulfur dioxide ($SO_2$) or water ($H_2O$), may also be used. A combination of dimethylzinc, nitric oxide and helium and/or nitrogen has also been found to be effective in forming zinc oxide films within the scope of the present invention.

In general, the deposition by CVD using a precursor containing dialkylzinc compounds, some of which are pyrophoric, combined with, for example, oxygen gas, particularly molecular oxygen, may produce zinc oxide material, but it is produced at an unacceptably high rate, resulting in an uncontrolled thermal reaction, i.e., fire. Known methods of preventing such an uncontrolled thermal reaction result in deposition of coatings at very low, commercially impractical rates, typically resulting in unacceptably thin layers. Known methods are also limited in the amount the precursor constituents can be increased, as too high a concentration results in gas phase reaction of the elements, and no film being produced. Experimental results indicate that in the inventive atmospheric pressure CVD process, the combination of DEZ and NO forms excellent zinc oxide films at commercially viable deposition rates without uncontrolled thermal reaction. Such films have been formed at deposition rates of >100 Å/sec, preferably >200 Å/sec, under dynamic laboratory conditions. It is possible that deposition rates greater than 300 Å/sec are achievable in a float bath due to the kinetics of that process when compared to laboratory test conditions.

Afforded benefits include increased deposition efficiency and advantageous changes to the reaction profile. The coating produced by the present invention typically has a refractive index in the range of about 1.90 to about 2.10, which is indicative of a zinc oxide coating essentially lacking any significant nitrogen component.

In a preferred embodiment of the present invention, the precursor mixture comprises about 6 to 30 percent NO, and about 1 to 2 percent DEZ, with the remainder comprising inert carrier gas. The above concentrations are expressed in gas phase percentages.

EXAMPLES

The following examples reflect actual experimental results carried out in a laboratory setting. Some examples of the conditions provided by the design are given in the following tables. Deposition was carried out using a total flow (TF) of 24-36 slm and DEZ concentrations of 0.5-1.5 volume % using a laboratory conveyor furnace at 630° C. Temperature at the coater face (CT(F)) was between 190° and 302° F. Table 1 describes the zinc oxide coatings formed under static deposition conditions, with a coating time of 15 seconds. Table 2 describes the zinc oxide coatings formed under dynamic deposition conditions, the substrate moving at 125 ipm relative to the coater. Coating thickness was determined optically for the statically deposited examples, and by etch and profile for the dynamically deposited samples, and film growth rate is reported in Angstroms per second. Essentially any remaining component in the examples comprises inert carrier gas.

TABLE 1

Examples 1 through 12: Static 15 s depositions, thickness determined optically

| Example | % DEZ | TF (slm) | % NO | CT (F.) | Coating Thickness Å | Peak Growth Rate (Å/s) |
|---|---|---|---|---|---|---|
| 1 | 1 | 30 | 15 | 575 | 3380 | 225 |
| 2 | 0.5 | 36 | 30 | 575 | 1000 | 67 |
| 3 | 0.5 | 36 | 7.5 | 575 | 1000 | 67 |
| 4 | 1.5 | 24 | 30 | 575 | 5500 | 367 |
| 5 | 1.5 | 24 | 7.5 | 575 | 6000 | 400 |
| 6 | 0.5 | 24 | 30 | 575 | 900 | 60 |
| 7 | 0.5 | 24 | 15 | 575 | 900 | 60 |
| 8 | 1 | 30 | 15 | 575 | 3380 | 225 |
| 9 | 0.5 | 30 | 15 | 475 | 6100 | 407 |
| 10 | 0.5 | 36 | 15 | 375 | 4500 | 300 |
| 11 | 0.5 | 24 | 7.5 | 375 | 3200 | 213 |
| 12 | 0.5 | 24 | 30 | 375 | 2600 | 173 |

Key:
TF = total gas flow;
CT = coater reactor face temperature
% of precursors are % by volume The data in Table 1 is not within the scope of the present invention, as all examples were deposited by static deposition methods. Examples 1-12 do, however, clearly show that the combination of a dialkylzinc compound and NO is capable of producing zinc oxide coatings on a glass substrate.

TABLE 2

Examples 13 through 16: Dynamic deposition at 125 ipm, thickness determined via etching a step, and then measuring step height with a profilometer.

| Example | % DEZ | % NO | TF (slm) | Coating Thickness Å | Integrated Growth Rate (Å/s) |
|---------|-------|------|----------|---------------------|------------------------------|
| 13 | 1.5 | 30  | 36 | 1760 | 262 |
| 14 | 1   | 30  | 30 | 926  | 138 |
| 15 | 1.5 | 7.5 | 30 | 1430 | 213 |
| 16 | 1.5 | 15  | 24 | 1454 | 216 |

Key:
TF = total gas flow
% of precursors are % by volume

TABLE 3

Examples 17 through 19:

| Example | % DEZ | % SO$_2$ | TF (slm) | Coating Thickness Å | Integrated Growth Rate (Å/s) |
|---------|-------|----------|----------|---------------------|------------------------------|
| 17 | 1   | 26 | 31 | 2600 | 173 |
| 18 | 0.7 | 47 | 32 | 5000 | 333 |
| 19 | 1   | 47 | 32 | 3700 | 247 |

TF = total gas flow
% of precursors are % by volume

TABLE 4

Examples 20 and 21: Dynamic deposition at 200 ipm, thickness determined via etching a step, and then measuring step height with a profilometer.

| Example | % DMZ | % NO | TF (slm) | Coating Thickness Å | Integrated Growth Rate (Å/s) |
|---------|-------|------|----------|---------------------|------------------------------|
| 20 | 1 | 50 | 31 | 926 | 193 |
| 21 | 1 | 30 | 35 | 716 | 149 |

Key:
TF = total gas flow
% of precursors are % by volume

Table 3 describes the zinc oxide coatings formed under static deposition conditions with a coating time of 15 seconds. Film thicknesses were determined optically.

The present invention yields high quality zinc oxide coatings from a combination of dialkylzinc compounds and an oxygen-containing compound, without ignition of the pyrophoric dialkylzinc. Additionally, the reaction profile when NO is utilized as the oxygen-containing compound could result in less pre-reaction, as stated above.

As can be seen from the Examples in Tables 2-4, the method of the present invention, under dynamic deposition conditions, produces ZnO coatings at useful thicknesses. It is particularly noteworthy that the deposition rates of known ZnO deposition methods are on the order of 30-60 Å/sec., whereas the growth rates demonstrated by the method of the present invention are consistently above 100 Å/sec., and in a number of instances above 200 Å/sec. Applicants believe that growth rates in excess of 300 Å/sec. are possible with optimization of the method of the present invention. So, it can be fairly said that the method of the present invention has shown ZnO film growth rates 5-10 times greater than the film growth rates of known methods.

The data set forth in Table 2 suggest that while the presence of NO as an oxygen source is beneficial, lower amounts of NO in the precursor composition appear to produce thicker ZnO films.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A dynamic chemical vapor deposition process for depositing a zinc oxide coating upon a heated glass substrate comprising the steps of:
providing a moving glass substrate having a major surface upon which the coating is to be deposited; and
directing a gaseous precursor mixture comprising a dialkylzinc compound, an inorganic oxygen-containing compound selected from the group consisting of NO, SO$_2$ and H$_2$O, and an inert carrier gas toward and along the surface to be coated, and reacting the mixture at or near the substrate surface at atmospheric pressure and at a temperature in the range of 565° C. to 730° C., to form a zinc oxide coating on the surface of the glass substrate at a growth rate >100 Å/sec.

2. The process for depositing a zinc oxide coating upon a glass substrate as defined in claim 1, wherein the dialkylzinc compound is diethylzinc.

3. The process for depositing a zinc oxide coating upon a glass substrate as defined in claim 1, wherein the dialkylzinc compound is dimethylzinc.

4. The process for depositing a zinc oxide coating upon the glass substrate as defined in claim 1, wherein the oxygen-containing compound comprises SO$_2$.

5. The process of depositing a zinc oxide coating upon the glass substrate as defined in claim 1, wherein the oxygen-containing compound comprises NO.

6. The process for depositing a zinc oxide coating as defined in claim 1, wherein the resultant coating on the glass substrate is essentially devoid of nitrogen.

7. The process for depositing a zinc oxide coating as defined in claim 1, wherein the inert carrier gas comprises at least one of nitrogen and helium.

8. The process for depositing a zinc oxide coating as defined in claim 1, wherein the ratio of the oxygen-containing compound to the dialkylzinc compound in the precursor mixture is from about 5:1 to about 30:1.

9. The process for depositing a zinc oxide coating as defined in claim 8, wherein the ratio of the oxygen-containing compound to the dialkyzinc compound in the precursor mixture is from about 5:1 to about 20:1.

10. The process for depositing a zinc oxide coating as defined in claim 1, wherein the zinc oxide coating is formed on the surface of the glass substrate at a growth rate >200 Å/sec.

11. The process for depositing a zinc oxide coating upon the glass substrate as defined in claim 1, wherein the glass substrate is moving at a speed of 125 ipm or greater.

12. The process for depositing a zinc oxide coating defined in claim 1, further comprising cooling the coated glass substrate to ambient temperature.

13. A dynamic chemical vapor deposition process for depositing a zinc oxide coating upon a hot glass substrate comprising:
providing a moving glass substrate having a major surface upon which the coating is to be deposited; and directing a gaseous precursor mixture comprising diethylzinc, nitric oxide and an inert carrier gas toward and along the surface to be coated, and reacting the mixture at or near the substrate surface at atmospheric pressure and at a temperature in the range of 565° C. to 730° C. to form a zinc oxide coating on the surface of the glass substrate at a growth rate >100 Å/sec.

14. A dynamic chemical vapor deposition process for depositing a zinc oxide coating upon a hot glass substrate comprising:

providing a moving hot glass substrate at atmospheric pressure having a major surface upon which the coating is to be deposited; and directing a precursor mixture comprising the tetramethyl ethylene diamine adduct of dialkylzinc, sulfur dioxide and an inert carrier gas toward and along the surface to be coated, and reacting the mixture at or near the substrate surface at atmospheric pressure and at a temperature in the range of 565° C. to 730° C. to form a zinc oxide coating on the surface of the glass substrate at a growth rate >100 Å/sec.

15. A dynamic chemical vapor deposition process for depositing a zinc oxide coating upon a hot glass substrate during a float glass manufacturing process comprising:

providing a continuous moving hot glass substrate at atmospheric pressure having a major surface upon which the coating is to be deposited; and directing a precursor mixture comprising dimethylzinc, nitric oxide and an inert carrier gas toward and along the surface to be coated, and reacting the mixture at or near the substrate surface at atmospheric pressure and at a temperature in the range of 565° C. to 730° C. to form a zinc oxide coating on the surface of the glass substrate at a growth rate >100 Å/sec.

16. A dynamic chemical vapor deposition process for depositing a zinc oxide coating upon a heated glass substrate comprising the steps of:

providing a moving heated glass substrate at atmospheric pressure, having a major surface upon which the coating is to be deposited; and directing a gaseous precursor mixture comprising a dialkylzinc compound, an inorganic oxygen-containing compound and an inert carrier gas toward and along the surface to be coated, and reacting the mixture at or near the substrate surface at atmospheric pressure, and at a temperature in the range of 565° C.-760° C. to form a zinc oxide coating on the surface of the glass substrate at a growth rate >100 Å/sec.

* * * * *